(12) United States Patent
Wang

(10) Patent No.: US 8,691,625 B2
(45) Date of Patent: Apr. 8, 2014

(54) METHOD FOR MAKING A CHIP PACKAGE

(75) Inventor: Meng-Jen Wang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 417 days.

(21) Appl. No.: 12/795,300

(22) Filed: Jun. 7, 2010

(65) Prior Publication Data

US 2011/0159638 A1    Jun. 30, 2011

(30) Foreign Application Priority Data

Dec. 31, 2009    (TW) .............................. 98146108 A

(51) Int. Cl.
*H01L 21/56* (2006.01)
(52) U.S. Cl.
USPC .................... 438/108; 257/E21.502
(58) Field of Classification Search
USPC .......... 438/106, 107, 108, 667, 672; 257/678, 257/737, 738, 774, 778, 787
See application file for complete search history.

(56) References Cited

U.S. PATENT DOCUMENTS

| | | | |
|---|---|---|---|
| 6,762,488 B2 * | 7/2004 | Maeda et al. ................. | 257/686 |
| 7,786,594 B2 * | 8/2010 | Lee et al. ...................... | 257/777 |
| 7,843,052 B1 * | 11/2010 | Yoo et al. ...................... | 257/686 |
| 2007/0126085 A1 | 6/2007 | Kawano et al. | |
| 2007/0287265 A1 * | 12/2007 | Hatano et al. ................. | 438/458 |
| 2008/0153204 A1 * | 6/2008 | Jackson et al. ................ | 438/109 |
| 2009/0242083 A1 * | 10/2009 | Ishida et al. .................. | 148/508 |
| 2009/0243083 A1 * | 10/2009 | Han et al. ...................... | 257/698 |

OTHER PUBLICATIONS

Office Action issued on Nov. 21, 2012 by the intellectual Property Office of R.O.C.(TIPO) for Taiwan Application No. 098146108, 10 pages.
English Summary of Office Action issued on Nov. 21, 2012 for Taiwan Application No. 098146108, 2 pages.

* cited by examiner

*Primary Examiner* — Kimberly Rizkallah
*Assistant Examiner* — Mounir Amer
(74) *Attorney, Agent, or Firm* — McCracken & Frank LLC

(57) ABSTRACT

The present invention relates to a method for making a chip package. The method includes the following steps: (a) providing a substrate having at least one conductive via; (b) disposing the substrate on a carrier; (c) removing part of the substrate, so as to expose the conductive via, and form at least one through via; (d) disposing a plurality of chips on a surface of the substrate, wherein the chips are electrically connected to the through via of the substrate; (e) forming an encapsulation; (f) removing the carrier; (g) conducting a flip-chip mounting process; (h) removing the encapsulation; and (i) forming a protective material. Whereby, the carrier and the encapsulation can avoid warpage of the substrate during the manufacturing process.

20 Claims, 9 Drawing Sheets

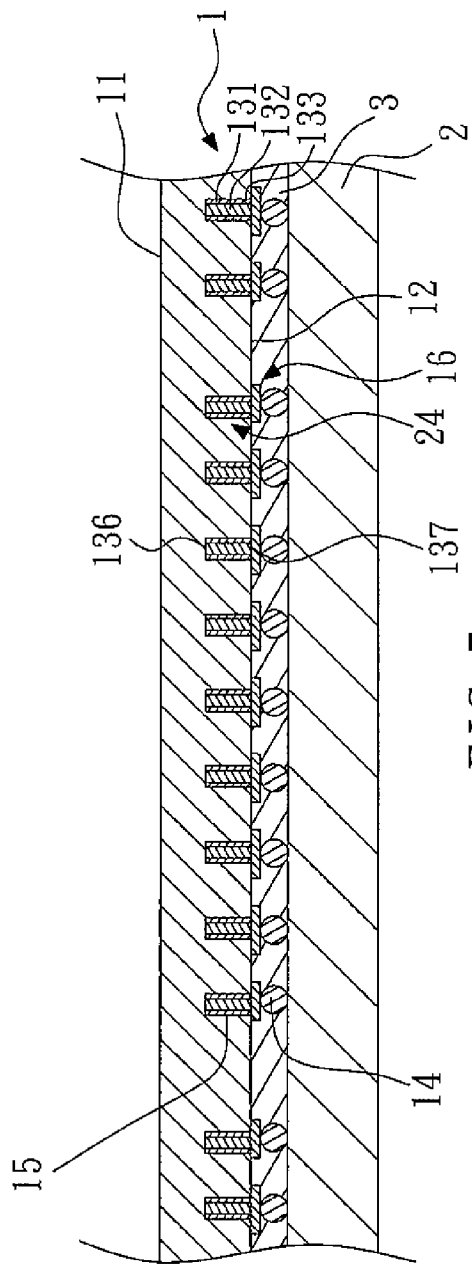
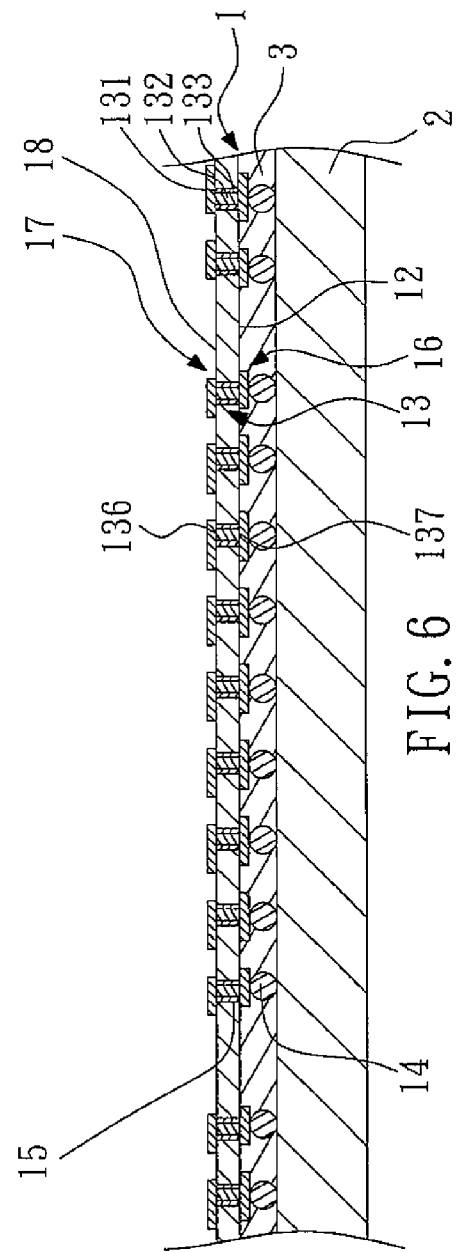
FIG. 5
FIG. 6

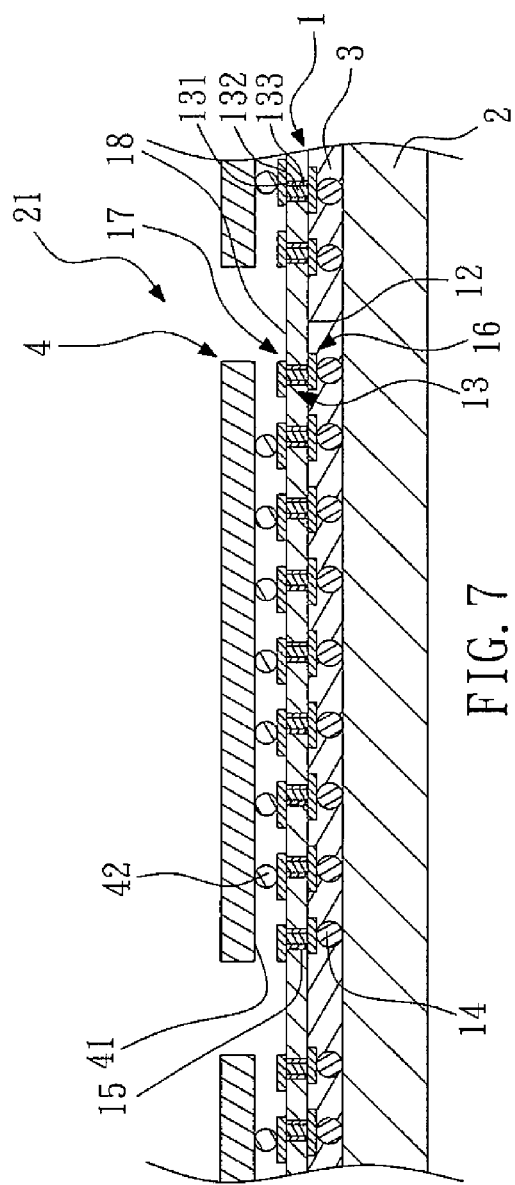
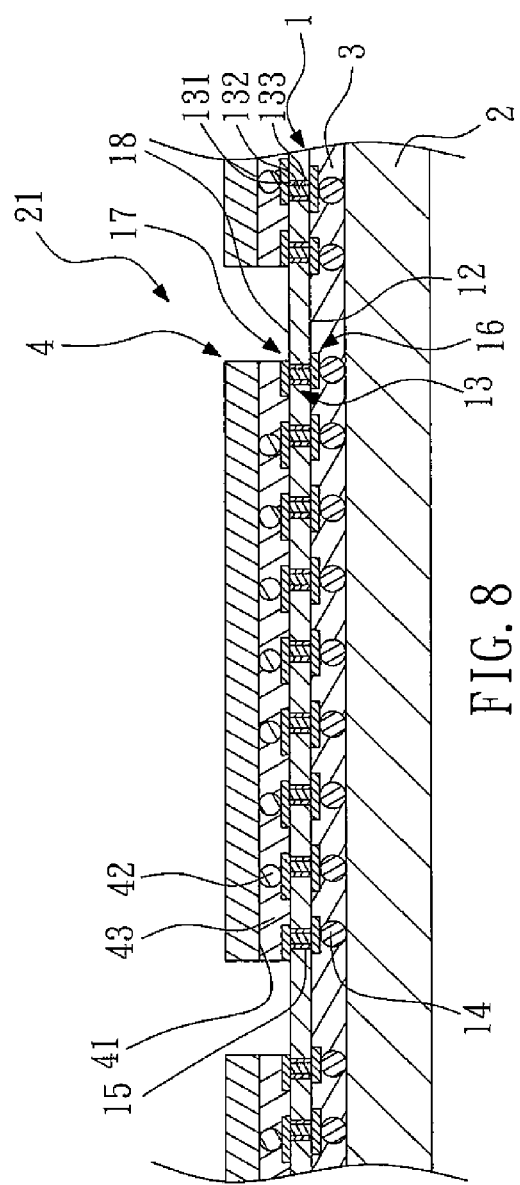
FIG. 7
FIG. 8

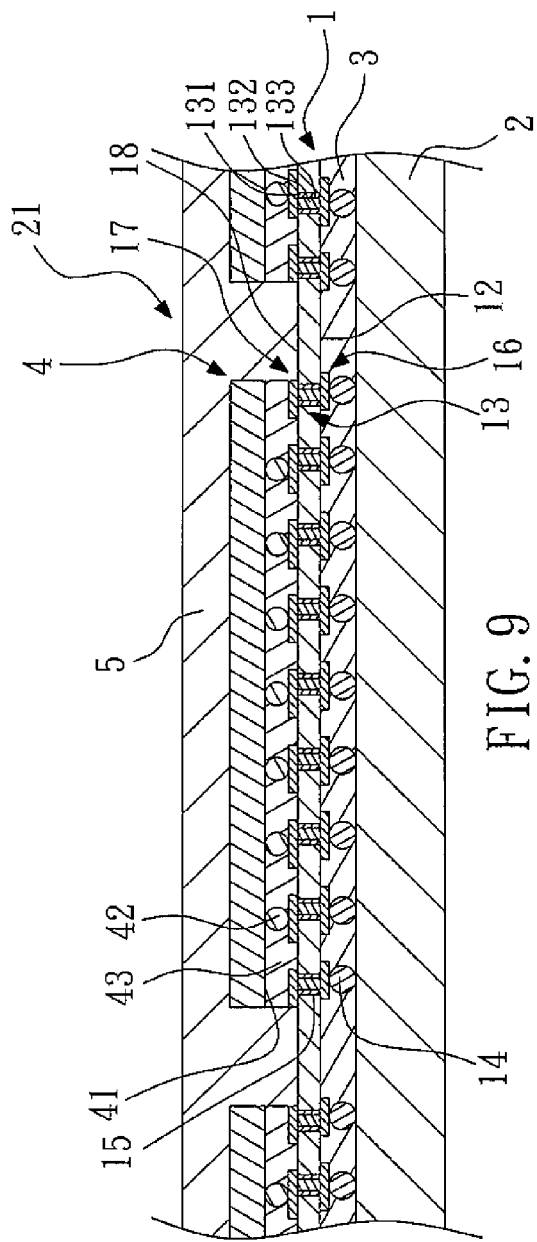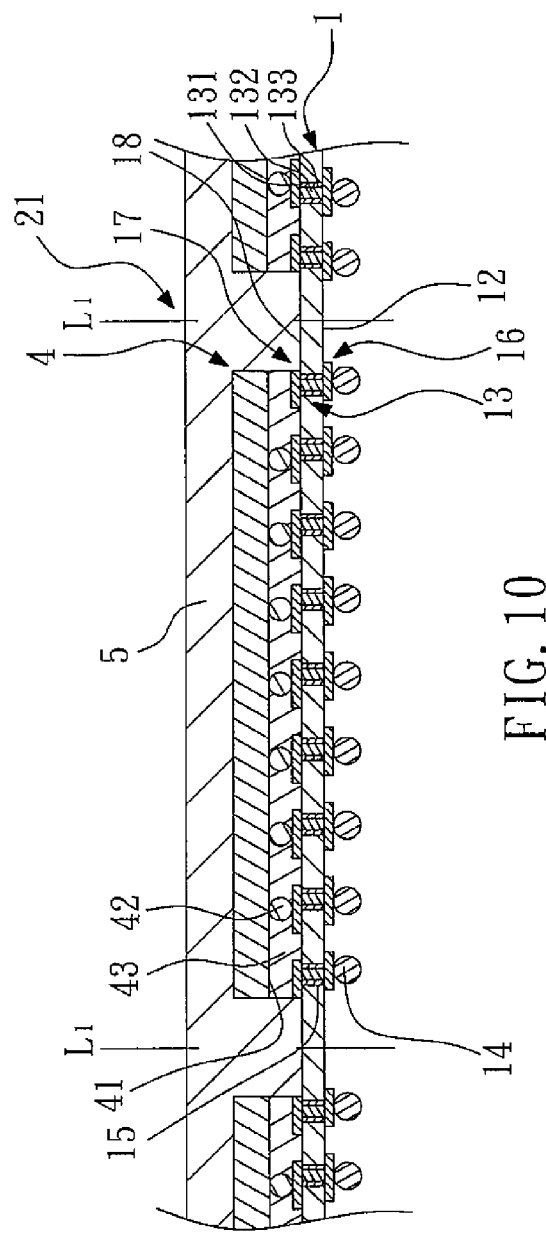

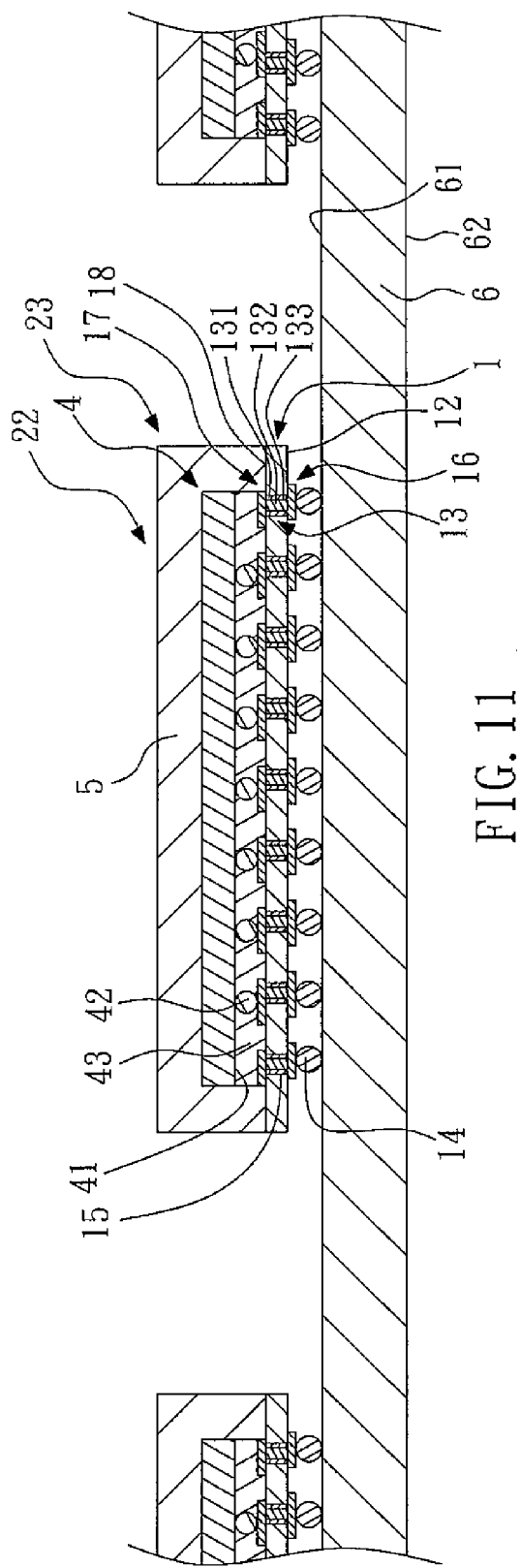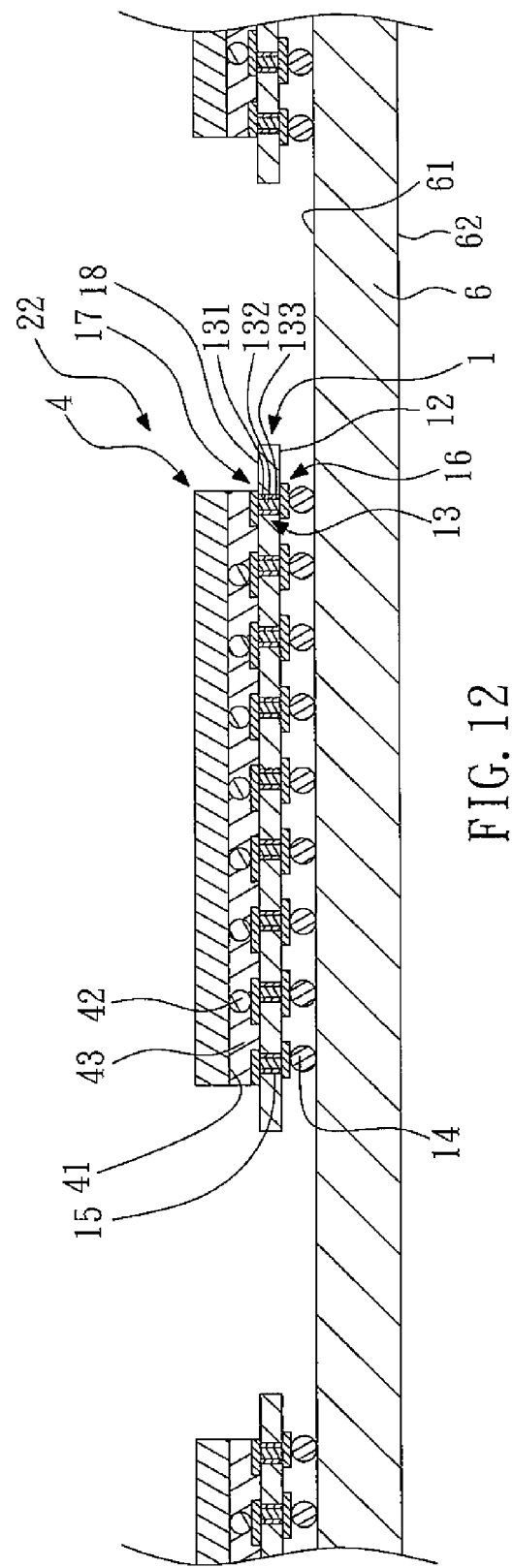

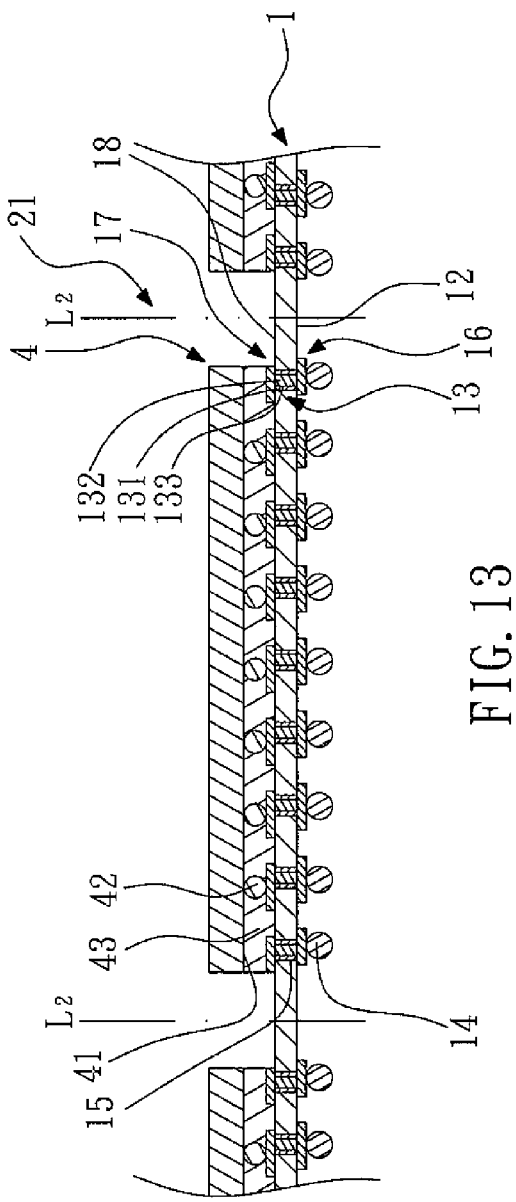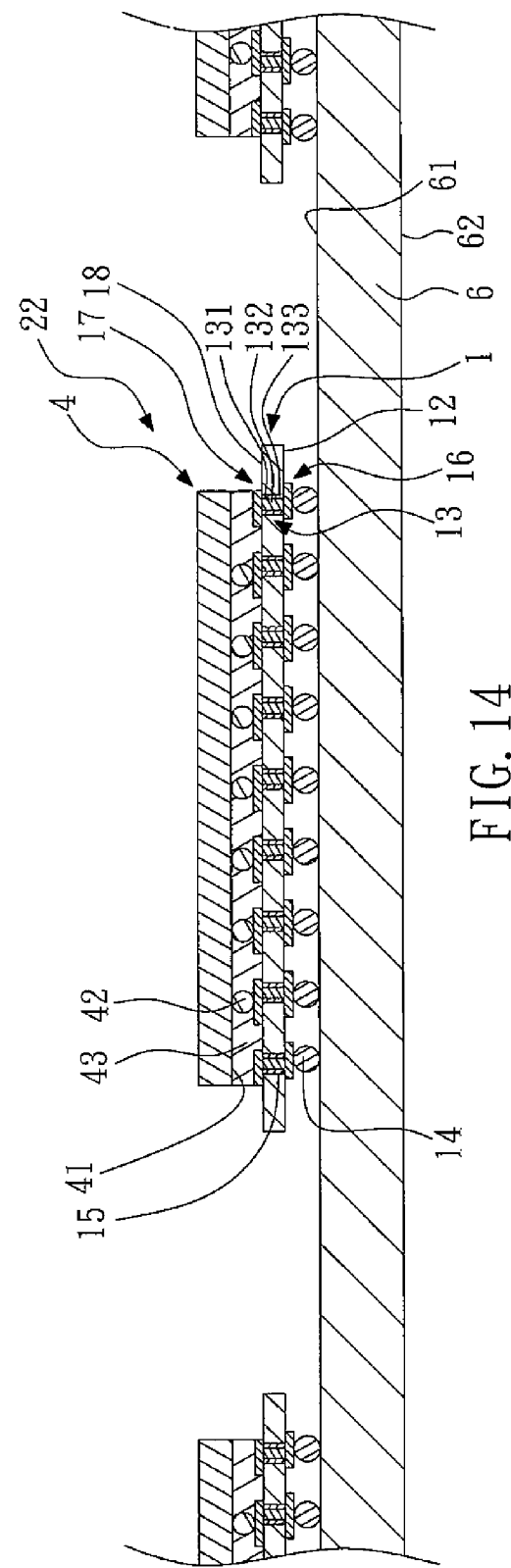

METHOD FOR MAKING A CHIP PACKAGE

BACKGROUND OF THE INVENTION

1. Field of the Invention

The present invention relates to a method for making a package, and more particularly to a method for making a chip package.

2. Description of the Related Art

Semiconductor industry works hard on forming light, thin and small products, therefore the thickness of the substrate (for example, a wafer or a silicon substrate) should be as thin as possible. Meanwhile, for mass-manufacturing, substrates with large size are used in major process, and in the end, the substrates are cut. However, as the substrates have larger size and thinner thickness, warpage of the substrates occurs easily, and the manufacturing process is difficult. Thus, the yield rate is decreased.

Therefore, it is necessary to provide a method for making a chip package to solve the above problems.

SUMMARY OF THE INVENTION

The present invention is further directed to a method for making a stackable package having an embedded interposer. The method comprises the following steps: (a) providing a substrate having a first surface, a second surface, at least one conductive via and at least one first bump, wherein the conductive via is disposed in the substrate, the first bump is disposed on the second surface and electrically connected to a first end of the conductive via; (b) disposing the substrate on a carrier, wherein the second surface of the substrate faces the carrier; (c) removing part of the substrate from the first surface of the substrate, so as to expose a second end of the conductive via to a third surface of the substrate, and form at least one through via in the substrate; (d) disposing a plurality of chips on the third surface of the substrate, wherein the chips are electrically connected to the through via of the substrate; (e) forming an encapsulation on part of the third surface of the substrate, wherein the encapsulation encapsulates the chips; (f) removing the carrier; (g) conducting a flip-chip mounting process, so that the first bump of the substrate contacts a receiving element; (h) removing the encapsulation; and (i) forming a protective material on the receiving element, wherein the protective material at least encapsulates the first bump of the substrate.

Whereby, the carrier and the encapsulation are used as a support of the substrate, so that the present invention can avoid warpage of the substrate during the manufacturing process. In addition, the carrier and the encapsulation are removed before the manufacturing process is completed, thus the yield rate of the product is increased and the thickness of the product is reduced.

BRIEF DESCRIPTION OF THE DRAWINGS

FIGS. 2 to 16 are schematic views of a method for making a chip package according to the present invention.

DETAILED DESCRIPTION OF THE INVENTION

Figure 1:
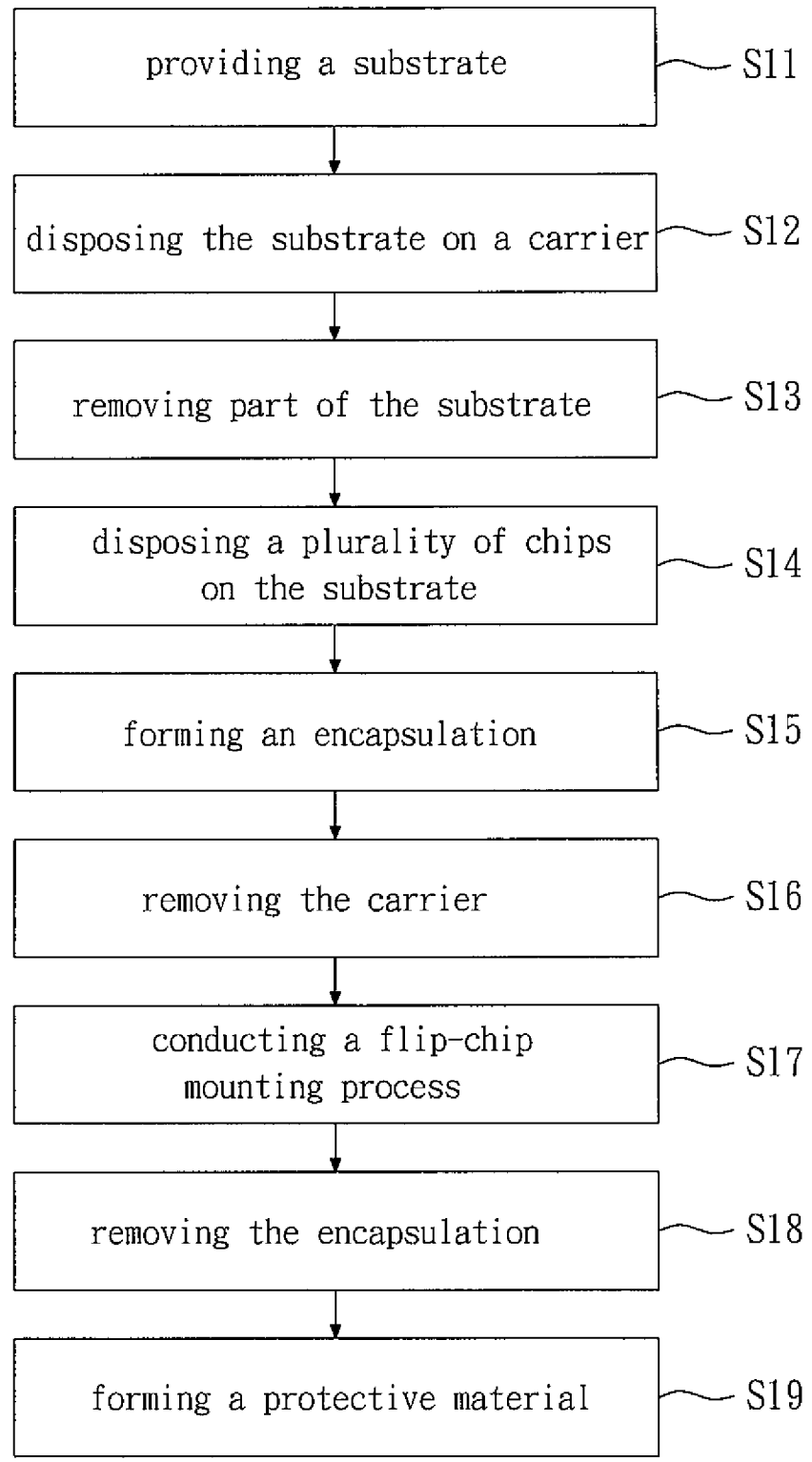
FIG. 1 is a flow chart of a method for making a chip package according to the present invention.
Figure 2:
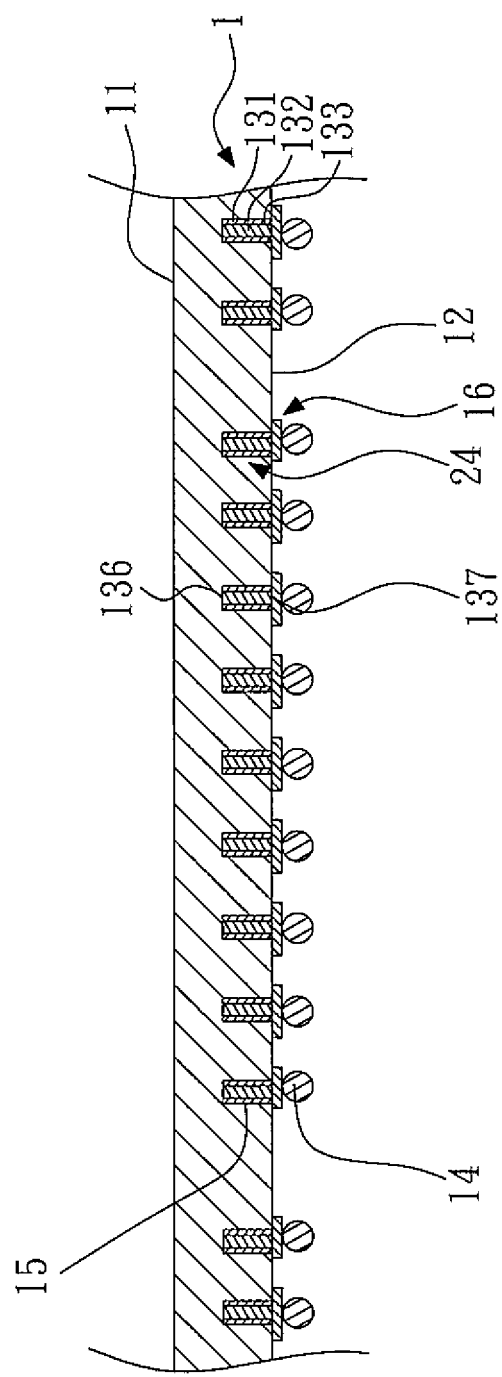

FIG. 1 shows a flow chart of a method for making a chip package according to the present invention. As shown in FIG. 2 and step S11, a substrate 1 is provided. The substrate 1 has a first surface 11, a second surface 12, at least one conductive via 24 and at least one first bump 14. The conductive via 24 is disposed in the substrate 1. The first bump 14 is disposed on the second surface 12, and electrically connected to a first end 137 of the conductive via 24.

Figure 3:
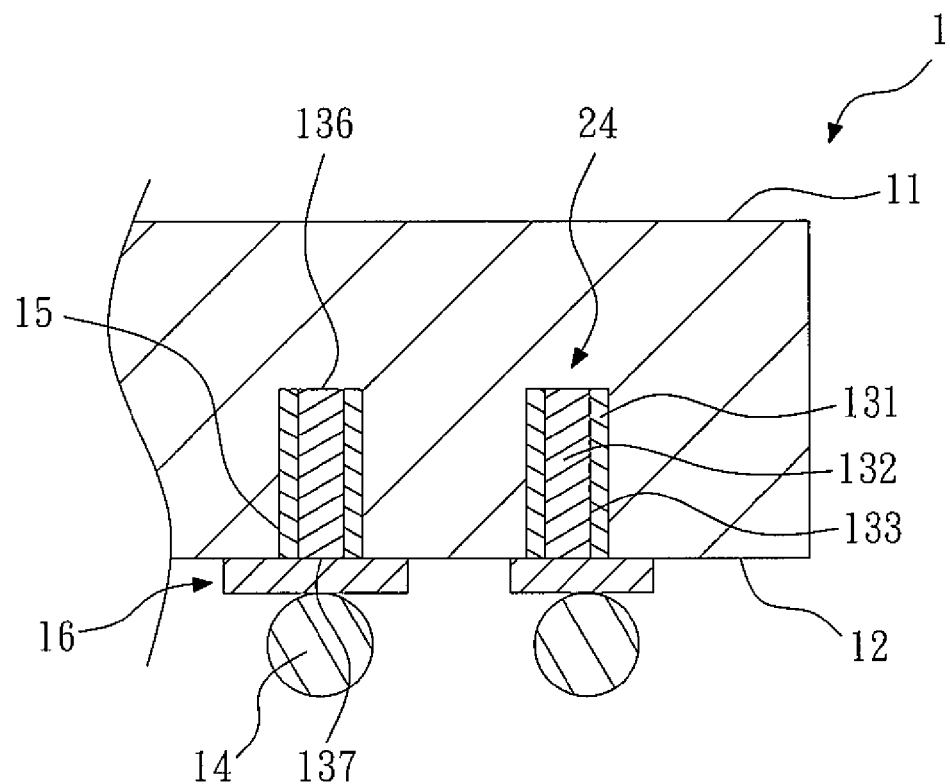

In this embodiment, as shown in FIG. 3, the substrate 1 is a silicon substrate, and the first end 137 of the conductive via 24 is exposed to the second surface 12. The substrate 1 further comprises at least one hole 15 and a first redistribution layer 16. The conductive via 24 comprises a first insulating layer 131 and a conductor 132. The first insulating layer 131 is disposed on the side wall of the hole 15, and defines a first groove 133. The conductor 132 fills up the first groove 133. In other embodiments, the first insulating layer 131 may also be disposed on a bottom wall (not shown) of the hole 15, that is, a second end 136 of the conductive via 24. The first redistribution layer 16 is disposed on the second surface 12 of the substrate 1, and the first bump 14 is electrically connected to the first end 137 of the conductive via 24 by the first redistribution layer 16.

Figure 4:
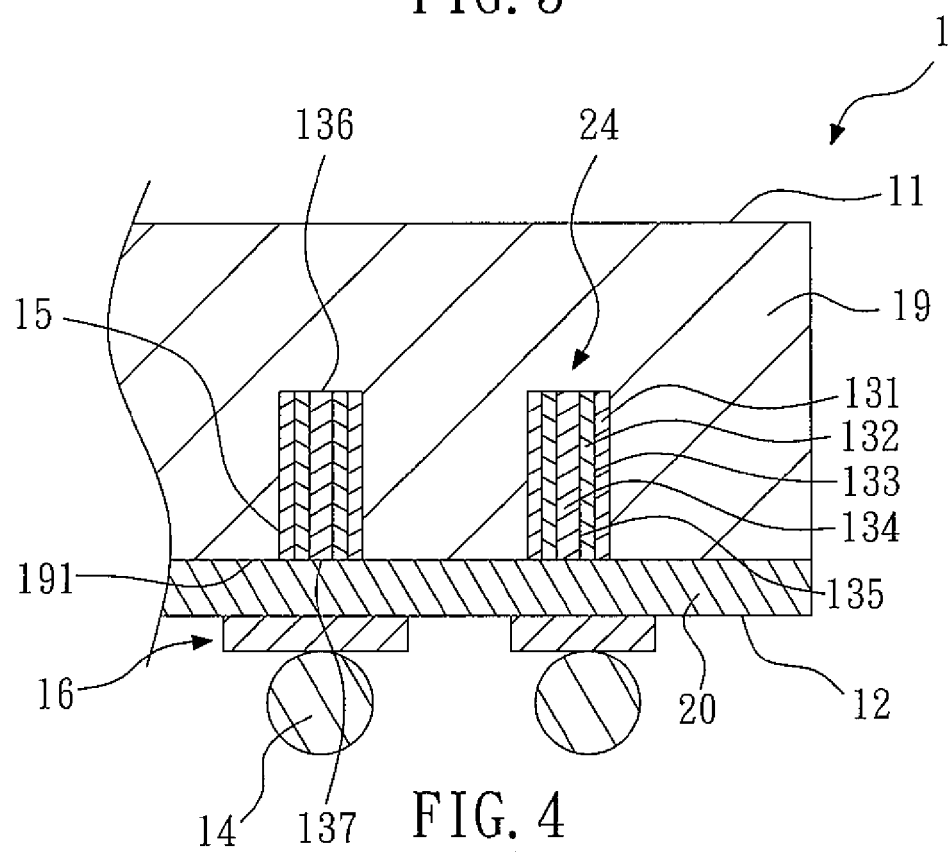

However, in other embodiments, as shown in FIG. 4, the substrate 1 is a wafer having a silicon substrate 19 and an active circuit layer 20. The silicon substrate 19 has the first surface 11, a bottom surface 191 and the hole 15. The bottom surface 191 is opposite the first surface 11. In other embodiments, the hole 15 can penetrate through the silicon substrate 19. The conductive via 24 is disposed in the silicon substrate 19. The active circuit layer 20 is disposed adjacent to the bottom surface 191 of the silicon substrate 19, electrically connects the conductive via 24 and the first bump 14, and has the second surface 12. The conductive via 24 further comprises a second insulating layer 134. The conductor 132 is disposed on the side wall of the first groove 133, and defines a second groove 135. The second insulating layer 134 fills up the second groove 135.

As shown in FIG. 5 and step S12, the substrate 1 is disposed on a carrier 2, and the second surface 12 of the substrate 1 faces the carrier 2. In this embodiment, the substrate 1 is adhered to the carrier 2 by an adhesive 3. The carrier 2 is used as a support of the substrate 1, which facilitates the following process.

As shown in FIG. 6 and step S13, part of the substrate 1 is removed from the first surface 11 of the substrate 1, so as to expose the second end 136 of the conductive via 24 (FIG. 5) to a third surface 18 of the substrate 1, and form at least one through via 13 in the substrate 1. In this embodiment, part of the substrate 1 is removed by grinding, and then trimmed by chemical-mechanical polishing (CMP). However, in other embodiments, part of the substrate 1 can be removed only by chemical-mechanical polishing (CMP). After removing part of the substrate 1, the thickness of the substrate 1 is less than 50 µm, and an ultrathin substrate is formed. Meanwhile, the substrate 1 is disposed on the carrier 2, and warpage of the substrate will not occur. Then, a second redistribution layer 17 is further formed on the third surface 18 of the substrate 1. The second redistribution layer 17 is electrically connected to the through via 13.

As shown in FIG. 7 and step S14, a plurality of chips 4 are disposed on third surface 18 of the substrate 1. The chips 4 are electrically connected to the through via 13 of the substrate 1. The chips 4 and the substrate 1 form an array package 21. In this embodiment, the chips 4 are electrically connected to the through via 13 by the second redistribution layer 17. Each chip 4 comprises an active surface 41, a backside surface, a side surface and at least one second bump 42, the second bump 42 is disposed on the active surface 41. The active surface 41 is opposite the backside surface, and the side surface is adjacent to the active surface 41. Preferably, the side surface is around the chip 4, and is substantially perpendicular to the active surface 41 of the chip 4. The chips 4 are electrically connected to the through via 13 of the substrate 1 by the second bump 42. However, in other embodiments, the second redistribution layer 17 is not formed, and the second bumps 42 of the chips 4 contact the through via 13 of the substrate 1 directly. As shown in, FIG. 8, preferably, a first underfill 43 is further formed on part of the third surface 18 of the substrate 1, so as to encapsulate the active surfaces 41 and the second bumps 42 of the chips 4. However, it is understood that, in the present invention, the form of the chips 4 is not limited to the flip chip according to the present embodiment.

As shown in FIG. 9 and step S15, an encapsulation 5 is formed on part of the third surface 18 of the substrate 1 to encapsulate the chips 4. In this embodiment, the encapsulation 5 is formed by spin coating, and the encapsulation 5 is a removable material. As shown in FIG. 10 and step S16, the carrier 2 and the adhesive 3 are removed. The encapsulation 5 is used to increase the thickness and the strength of the substrate 1 so as to be a support of the substrate 1. Therefore, the present invention can avoid warpage of the substrate 1 after removing the carrier 2.

As shown in FIG. 11 and step S17, a flip-chip mounting process is conducted. As shown in FIG. 12 and step S18, the encapsulation 5 is removed. In this embodiment, as shown in FIG. 10, the array package 21 is cut along at least one cutting line $L_1$, so as to form a plurality of sub-package units 23 (FIG. 11). The sub-package units 23 comprise the chip packages 22 and the encapsulation 5. As shown in FIG. 11 and step S17, a flip-chip mounting process is conducted, the sub-package units 22 are disposed on the receiving element 6. The receiving element 6 has a first surface 61 and a second surface 62, so that the first bump 14 of the substrate 1 contacts the first surface 61 of the receiving element 6. As shown in FIG. 12 and step S18, the encapsulation 5 is then removed, and a plurality of chip package units 22 are formed. The chip package units 22 comprise the chips 4 and the substrate 1. Meanwhile, the receiving element 6 is also used as the support of the substrate 1, which avoids warpage of the substrate 1 after removing the encapsulation 5.

In this embodiment, the encapsulation 5 is a peelable material with better thermoplasticity so that the encapsulation 5 can be softened by heating, so as to remove the encapsulation 5. However, in other embodiments, the encapsulation 5 can be a material that can be softened under ultraviolet ray, so that the encapsulation 5 can be softened by providing ultraviolet ray, so as to remove the encapsulation 5. Alternatively, the encapsulation 5 can be removed by directly peeling or etching with a solvent. Whereby, the encapsulation 5 is removed before the manufacturing process is completed, so it does not exist in the final product. Therefore, the thickness of the product is reduced, and the present invention can avoids using a conventional molding compound which is irremovable, because the conventional molding compound is hardened after heating. In this embodiment, the encapsulation 5 is completely removed to expose at least one side surface of each of the chips 4 and the third surface 18 of the substrate 1. The exposed side surface is around the chip 4, and is substantially perpendicular to the active surface 41 of the chip 4. However, in other embodiments, the encapsulation 5 can be removed partially to at least expose the side surface of each of the chips 4 and a part of the third surface 18 of the substrate 1.

In addition, in other embodiments, as shown in FIG. 13 and step S18, the array package 21 is disposed on a sawing tape (not shown), and then the encapsulation 5 (FIG. 10) is removed, and therefore avoids warpage of the substrate 1 after removing the encapsulation 5. Then, a cutting process is conducted, that is, the array package 21 is cut along at least one cutting line $L_2$, so as to form the separated chip package units 22 (FIG. 14). The chip package units 22 comprise the chips 4 and the substrate 1. As shown in FIG. 14 and step S17, a flip-chip mounting process is conducted, the chip package units 22 are disposed on the receiving element 6, so that the first bump 14 of the substrate 1 contacts the first surface 61 of the receiving element 6.

Figure 15:
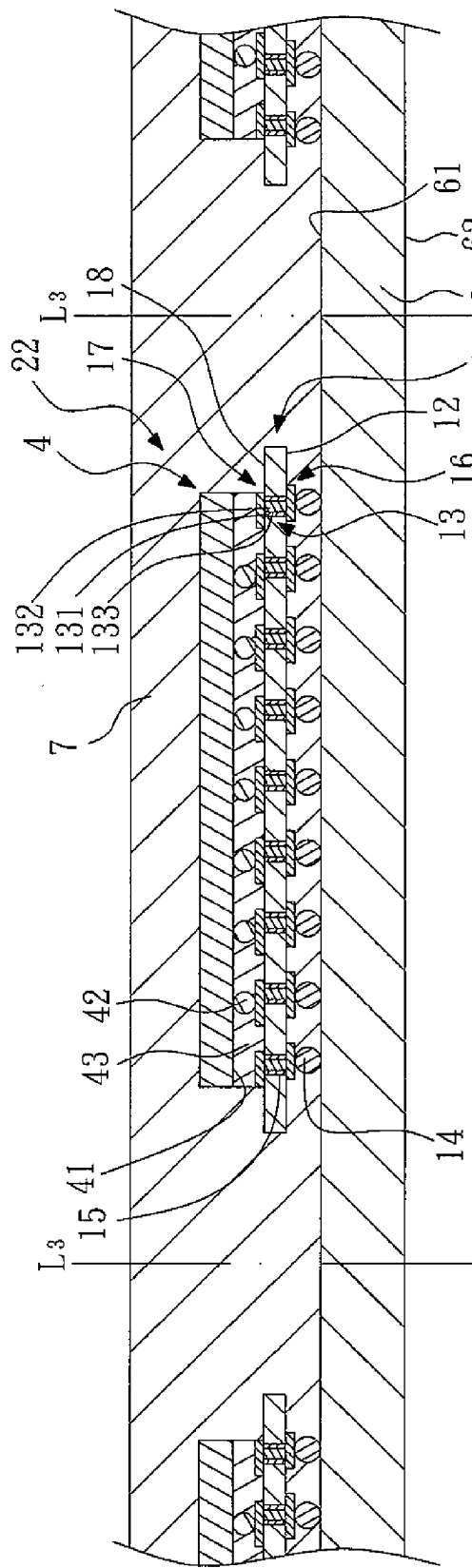
Figure 16:
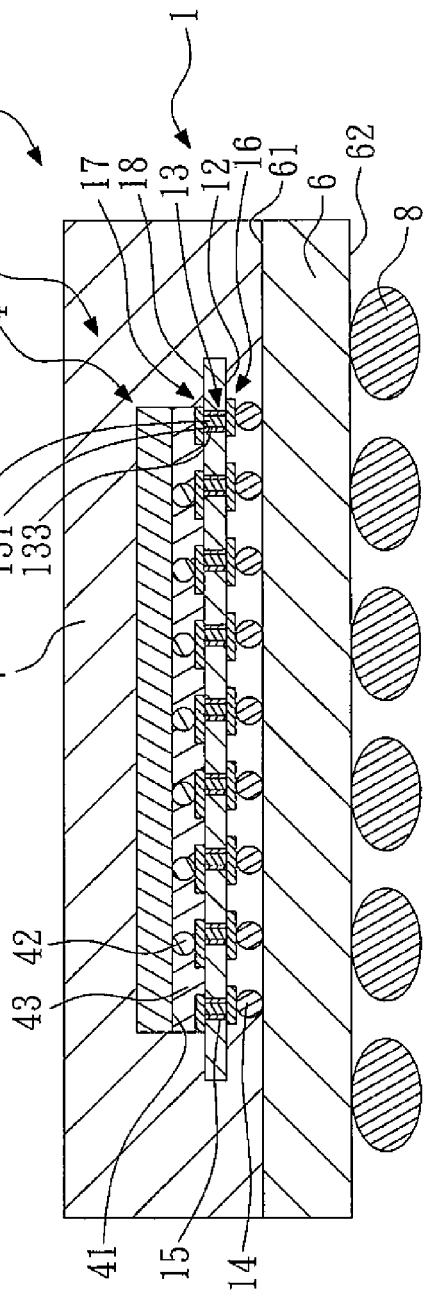

As shown in FIG. 15 and step S19, a protective material 7 is formed on part of the first surface 61 of the receiving element 6, and at least encapsulates the first bump 14 of the substrate 1. In this embodiment, the protective material 7 is a molding compound. The molding compound is formed on the first surface 61 of the receiving element 6, and encapsulates the chip package units 22. However, in other embodiments, the protective material 7 can be a second underfill (not shown) formed on part of the first surface 61 of the receiving element 6, so as to encapsulate the first bump 14 of the substrate 1, or, the protective material 7 further comprises a molding compound (not shown), the molding compound is formed on part of the first surface 61 of the receiving element 6, and encapsulates the chip package units 22 and the second underfill. As shown in, FIG. 16, preferably, at least one solder ball 8 is further formed on the second surface 62 of the receiving element 6, and electrically connected to an exterior element. Then, the receiving element 6 and the protective material 7 are cut along at least one cutting line $L_3$ (FIG. 15), so that a chip package 9 according to the present invention is formed.

Whereby, the carrier 2 and the encapsulation 5 are used as a support of the substrate 1, so that the present invention can avoid warpage of the substrate 1 during the manufacturing process, and the carrier 2 and the encapsulation 5 are removed before the manufacturing process is completed, thus the yield rate of the product is increased and the thickness of the product is reduced.

While several embodiments of the present invention have been to illustrated and described, various modifications and improvements can be made by those skilled in the art. The embodiments of the present invention are therefore described in an illustrative but not restrictive sense. It is intended that the present invention should not be limited to the particular forms as illustrated, and that all modifications which maintain the spirit and scope of the present invention are within the scope defined by the appended claims.

What is claimed is:

1. A method for making a chip package, comprising:
    (a) providing a substrate having a first surface, a second surface, at least one conductive via and at least one first bump, wherein the conductive via is disposed in the substrate, the first bump is disposed on the second surface and electrically connected to a first end of the conductive via;
    (b) disposing the substrate on a carrier, wherein the second surface of the substrate faces the carrier;
    (c) removing part of the substrate from the first surface of the substrate, so as to expose a second end of the conductive via to a third surface of the substrate, and form at least one through via in the substrate;
    (d) disposing a plurality of chips on the third surface of the substrate, wherein the chips are electrically connected to the through via of the substrate, each of the chips has an active surface, a backside surface and a side surface, wherein the active surface is opposite the backside surface, and the side surface is adjacent to the active surface;

(e) forming an encapsulation on part of the third surface of the substrate, wherein the encapsulation encapsulates the chips;

(f) removing the carrier;

(g) conducting a flip-chip mounting process, so that the first bump of the substrate contacts a receiving element;

(h) removing the encapsulation to expose at least one side surface of each of the chips, wherein the exposed side surface is around the chip; and (i) forming a protective material on the receiving element, wherein the protective material at least encapsulates the first bump of the substrate.

2. The method as claimed in claim 1, wherein in the step (a), the substrate is a wafer having a silicon substrate and an active circuit layer, the silicon substrate has the first surface, a bottom surface and at least one hole, the bottom surface is opposite the first surface, the hole penetrates through the silicon substrate, and the conductive via is disposed in the silicon substrate, the active circuit layer is disposed adjacent to the bottom surface of the silicon substrate, electrically connects the conductive via and the first bump, and has the second surface.

3. The method as claimed in claim 1, wherein in the step (a), the substrate is a silicon substrate, and the first end of the conductive via is exposed to the second surface.

4. The method as claimed in claim 1, wherein in the step (a), the substrate further comprises at least one hole, the conductive via comprises a first insulating layer and a conductor, the first insulating layer is disposed on the side wall of the hole, and defines a first groove, the conductor fills up the first groove.

5. The method as claimed in claim 1, wherein in the step (a), the substrate further comprises at least one hole, the conductive via comprises a first insulating layer, a conductor and a second insulating layer, the first insulating layer is disposed on the side wall of the hole, and defines a first groove, the conductor is disposed on the side wall of the first groove, and defines a second groove, the second insulating layer fills up the second groove.

6. The method as claimed in claim 1, wherein in the step (a), the substrate further comprises a first redistribution layer disposed on the second surface of the substrate, and the first bump is electrically connected to the first end of the conductive via by the first redistribution layer.

7. The method as claimed in claim 1, wherein in the step (b), the substrate is adhered to the carrier by an adhesive, in the step (f), the method further comprises a step of removing the adhesive.

8. The method as claimed in claim 1, wherein in the step (c), part of the substrate is removed by grinding or chemical-mechanical polishing (CMP).

9. The method as claimed in claim 1, wherein the thickness of the substrate is less than 50 μm after the step (c).

10. The method as claimed in claim 1, further comprising a step of forming a second redistribution layer on the third surface of the substrate after the step (c), wherein the second redistribution layer is electrically connected to the through via.

11. The method as claimed in claim 10, wherein in the step (d), the chips are electrically connected to the through via by the second redistribution layer.

12. The method as claimed in claim 1, wherein in the step (d), each chip comprises an active surface and at least one second bump, the second bump is disposed on the active surface, and the chips are electrically connected to the through via of the substrate by the second bump.

13. The method as claimed in claim 12, wherein in the step (d), the second bump of the chip contacts the through via of the substrate directly.

14. The method as claimed in claim 1, wherein in the step (e), the encapsulation is a removable material.

15. The method as claimed in claim 1, wherein in the step (e), the encapsulation is formed by spin coating.

16. The method as claimed in claim 1, wherein a cutting process is conducted before the step (g), so as to form a plurality of sub-package units, and then, the flip-chip mounting process of the step (g) is conducted, the sub-package units are disposed on the receiving element, and then, the step (h) is conducted, the encapsulation is removed, so as to form a plurality of chip package units, the chip package units comprise the chip and the substrate.

17. The method as claimed in claim 1, wherein in the step (h), the encapsulation is removed by directly peeling, etching with a solvent, heated or under ultraviolet ray.

18. The method as claimed in claim 1, wherein in the step (i), the protective material is a molding compound, the molding compound is formed on a first surface of the receiving element, and encapsulates the chip package units.

19. The method as claimed in claim 1, wherein in the step (i), the protective material comprises a second underfill and a molding compound, the second underfill is formed on part of a first surface of the receiving element, so as to encapsulate the first bump of the substrate, the molding compound is formed on part of the first surface of the receiving element, and encapsulates the chip package units.

20. The method as claimed in claim 1, wherein in the step (h), the exposed side surface is substantially perpendicular to an active surface of the chip.

* * * * *